(12) United States Patent
Foster et al.

(10) Patent No.: US 8,404,568 B2
(45) Date of Patent: Mar. 26, 2013

(54) SYSTEMS AND METHODS FOR FABRICATING AN OUT-OF-PLANE MEMS STRUCTURE

(75) Inventors: Michael Foster, Issaquah, WA (US); Shifang Zhou, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 1307 days.

(21) Appl. No.: 12/163,277

(22) Filed: Jun. 27, 2008

(65) Prior Publication Data

US 2009/0321008 A1    Dec. 31, 2009

(51) Int. Cl.
*H01L 21/326* (2006.01)

(52) U.S. Cl. ............... 438/466; 257/E29.167; 438/469; 438/470

(58) Field of Classification Search ........... 257/E29.167; 438/466, 469, 470
See application file for complete search history.

(56) References Cited

U.S. PATENT DOCUMENTS

| 7,487,678 B2 * | 2/2009 | Foster et al. ................ 73/432.1 |
| 2008/0128839 A1 * | 6/2008 | Sotokawa et al. ............. 257/415 |

* cited by examiner

*Primary Examiner* — Shamim Ahmed
*Assistant Examiner* — Christopher Remavege
(74) *Attorney, Agent, or Firm* — Lowe Graham Jones PLLC

(57) ABSTRACT

System and methods offset mechanism elements during fabrication of Micro-Electro-Mechanical Systems (MEMS) devices. An exemplary embodiment applies a voltage across an offset mechanism element and a bonding layer of a MEMS device to generate an electrostatic charge between the offset mechanism element and the bonding layer, wherein the electrostatic charge draws the offset mechanism element to the bonding layer. The offset mechanism element and the bonding layer are then bonded.

12 Claims, 2 Drawing Sheets

SYSTEMS AND METHODS FOR FABRICATING AN OUT-OF-PLANE MEMS STRUCTURE

BACKGROUND OF THE INVENTION

A Micro-Electro-Mechanical Systems (MEMS) device may have one or more offset mechanism elements that are oriented in an out-of-plane position (offset) with respect to its originally-formed mechanism layer. FIG. 1 is a cross section view of a prior art MEMS device 100 during fabrication with an offset mechanism element 102 that is moved to an out-of-plane position with respect to two other mechanism elements 104 and 106 that are oriented along the plane of their originally-formed mechanism layer 108. The offset mechanism element 102 is flexibly coupled to the mechanism element 104 with a flexure 110 to hold the offset mechanism element 102 in a desired position during various stages of the fabrication process.

The completed MEMS device 100 will have the offset mechanism element 102 anodically bonded to the bonding layer 112, which is typically glass or the like. During the fabrication process (prior to the fabrication process stage illustrated in FIG. 1), the offset mechanism element 102 is partially separated from the mechanism layer 108 using known techniques, such as etching and/or other suitable micromachining processes. A connection is maintained between elements 102 and 104 by a flexure represented by element 110. After separation, the offset mechanism element 102 is aligned with the other mechanism elements 104 and 106 along an originally-formed mechanism layer 108. At some point during the fabrication process, the offset mechanism element 102 is physically moved into an offset position so that it may be anodically bonded to the bonding layer 112. A tool 114, or other suitable means for moving the offset mechanism element 102, physically exerts a downward force, illustrated by the direction arrow 116, onto the offset mechanism element 102 to move it into its offset position. The flexure 110 facilitates the movement of the offset mechanism element 102 as the tool 114 pushes it downward to its offset position. The flexure 110 may remain or may be removed during later stages of the fabrication process depending upon the nature of the MEMS device 100.

Because of the physical size constraints associated with the tool 114, the size of the offset mechanism element 102 is limited so as to provide a sufficiently large contact area 118. The contact area 118 must be large enough so that the working end of the tool 114 may be positioned so as to come into contact with the contact area 118. Further, sufficient physical strength must be provided about the contact area 118 to provide adequate structural support to accommodate the applied force and to protect the offset mechanism element 102 against damage that may otherwise be caused by the tool 114.

Proper offsetting of the offset mechanism element 102 requires precise control of the tool 114. Highly accurate position and alignment of the tool 114 with respect to the offset mechanism element 102 is required so that the force is applied only to the offset mechanism element 102. And, the force applied by the tool 114 onto the offset mechanism element 102 must be precisely controlled to achieve the desired movement of the offset mechanism element 102 without imparting a damaging force onto the offset mechanism element 102.

In view of the size constraints associated with the contact area 118, and the control issues associated with the tool 114, it is appreciated that there is an inherent limit to the physical properties of the offset mechanism element 102. The offset mechanism element 102 must have sufficient structural strength to accommodate the applied force exerted by the tool 114 without sustaining damage. And, the offset mechanism element 102 must be large enough for the tool 114 to accurately contact the contact area 118. Thus, prior art MEMS fabrication processes that employ the tool 114 may be limiting in many instances as MEMS devices become increasingly more complex and smaller. Accordingly, it is desirable for an improved MEMS fabrication process that does not require the tool 114.

SUMMARY OF THE INVENTION

Systems and methods of offsetting mechanism elements during fabrication of Micro-Electro-Mechanical Systems (MEMS) devices are disclosed. An exemplary embodiment applies a voltage across an offset mechanism element and a bonding layer of a MEMS device to generate an electrostatic charge between the offset mechanism element and the bonding layer. The electrostatic charge draws the offset mechanism element to the bonding layer. The offset mechanism element and the bonding layer are then bonded.

In accordance with further aspects, an exemplary embodiment comprises a MEMS device with an offset mechanism element disposed above a bonding layer and a voltage source electrically coupled to the offset mechanism element and the bonding layer. The voltage source is configured to generate a voltage that is applied across the offset mechanism element and the bonding layer to generate an electrostatic charge between the offset mechanism element and the bonding layer, wherein the electrostatic charge draws the offset mechanism element to the bonding layer.

BRIEF DESCRIPTION OF THE DRAWINGS

Preferred and alternative embodiments are described in detail below with reference to the following drawings.

DETAILED DESCRIPTION OF THE PREFERRED EMBODIMENT

Figure 1:
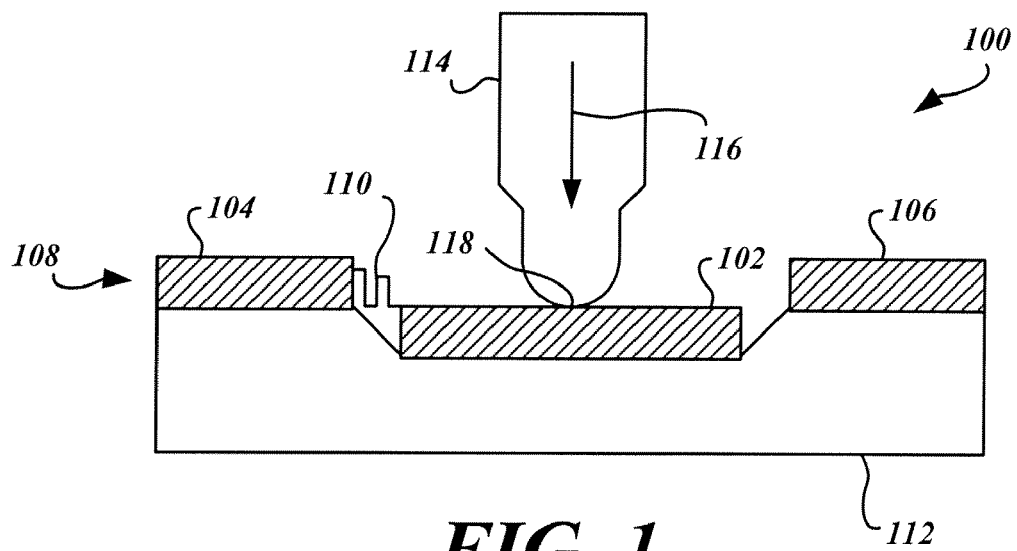
FIG. 1 is a cross section view of a prior art MEMS device during fabrication with an offset mechanism element that is moved to an out-of-plane position with respect to other mechanism elements.
Figure 2:
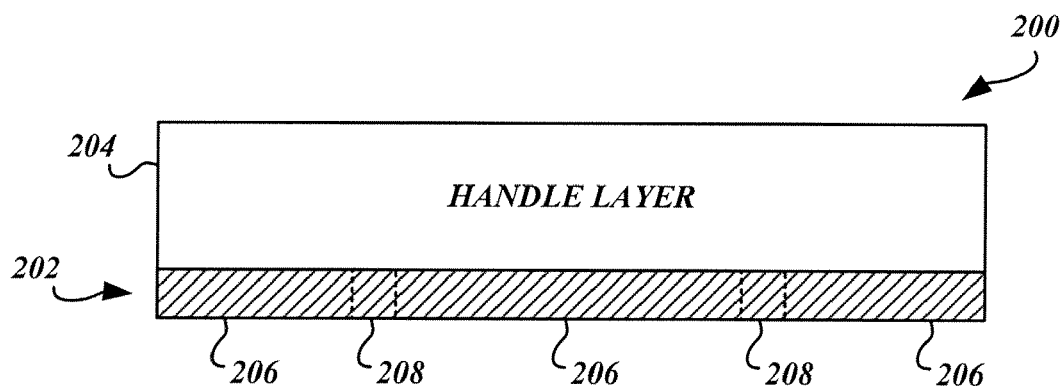
FIG. 2 is a cross section view of a MEMS device during an early stage of its fabrication process wherein a mechanism layer has been attached to a handle layer.

FIG. 2 is a cross section view of a Micro-Electro-Mechanical Systems (MEMS) device 200 during an early stage of its fabrication process wherein a mechanism layer 202 has been attached to a handle layer 204. During this stage of the fabrication process, the mechanism layer 202 is bonded to the handle layer 204. The mechanism layer 202 includes portions 206 and portions 208. The portions 206 will be later fabricated into MEMS device mechanism elements. The portions 208 will be wholly or partially removed using one or more suitable processes. For example, etching or the like may be used to remove part or all of the portions 208 wherein a mask (not shown) may be used to define the MEMS device mechanism elements. Alternatively, or additionally, any suitable micromachining process may be used to fabricate the portions 206 into MEMS device mechanism elements and/or to remove part or all of the portions 208.

Figure 3:
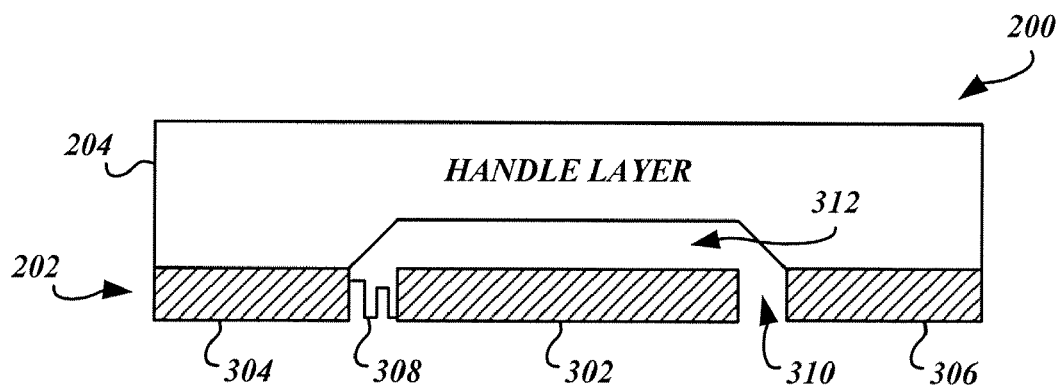
FIG. 3 is a cross section view of the MEMS device during a later stage of its fabrication process wherein an offset mechanism element and one or more other mechanism elements are to be formed in the mechanism layer.

FIG. 3 is a cross section view of a MEMS device 200 during a later stage of its fabrication process wherein an offset mechanism element 302 and one or more other mechanism elements 304 and 306 are to be formed in the mechanism layer 202. During this exemplary stage of the fabrication process, the offset mechanism element 302 and the mechanism elements 304 and 306 are oriented along the plane of the originally-formed mechanism layer 202.

The offset mechanism element 302 is coupled to the mechanism element 304 by a flexure 308 that holds the offset mechanism element 302 in a desired position during various stages of the fabrication process. The flexure 308 facilitates the movement of the offset mechanism element 302 during a later stage of the fabrication process, described below. The flexure 308 may remain or may be removed during later fabrication process stages depending upon the nature of the MEMS device 200. It is appreciated that a plurality of flexures 308 may be used to control the position and/or to facilitate the movement of the offset mechanism element 302 into its offset position. Such flexures 308 may be coupled to any suitable anchor point on the mechanism layer 202.

A region 310 is illustrated as separating the offset mechanism element 302 from the adjacent mechanism element 306. The region 310 is formed when the portion 208 (FIG. 2) has been removed from the mechanism layer 202. It is appreciated that the offset mechanism element 302 has also been separated from other adjacent mechanism elements (not shown) and adjacent portions of the mechanism layer 202. Thus, the offset mechanism element 302 is sufficiently detached from the mechanism layer 202 (though held in place by one or more flexures 308) so that the offset mechanism element 302 may be moved into its ultimate offset position during a later stage of the fabrication process, described below.

Further, the offset mechanism element 302 is illustrated as being separated from the handle layer 204 by a region 312. That is, the offset mechanism element 302 is released from the handle layer 204 so that it can freely move into its offset position. The separation of the offset mechanism element 302 from the handle layer 204 may be effected using any suitable technique, such as under etching or the like that forms the region 312. For example, a portion of the handle layer 204 and/or a portion of the offset mechanism element 302 may be etched. The mechanism elements 304 and 306 remain attached to the handle layer 204 at this stage of the fabrication process. The detachment of the offset mechanism element 302 from the handle layer 204 may be done during any suitable stage of the fabrication process.

Figure 4:
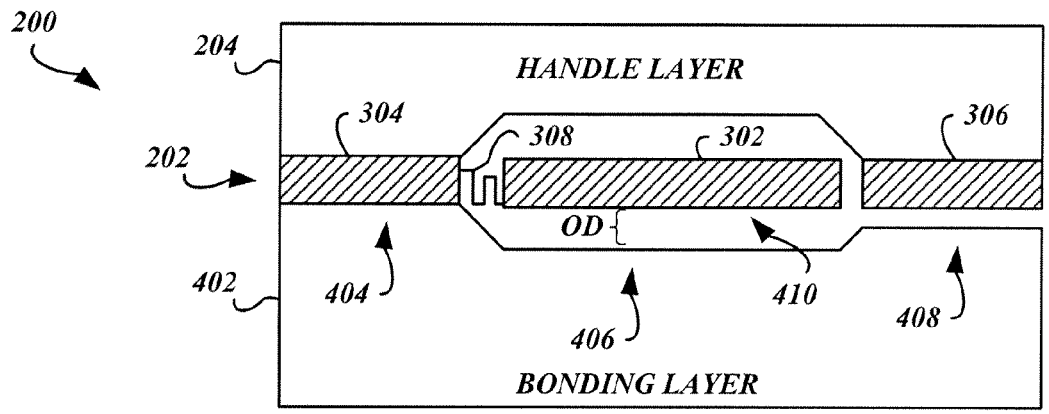
FIG. 4 is a cross section view of the MEMS device during a later stage of its fabrication process wherein a bonding layer is positioned adjacent to the offset mechanism element and the mechanism elements.

FIG. 4 is a cross section view of a MEMS device 200 during a later stage of its fabrication process wherein a bonding layer 402 is positioned adjacent to the offset mechanism element 302 and the mechanism elements 304 and 306. In this simplified example of the MEMS device 200, it is desirable to, at a later stage of the fabrication process, bond the mechanism element 304 to the bonding layer 402 at a region 404. Also, it is desirable to bond the offset mechanism element 302 to the bonding layer 402 at a region 406. However, in this simplified example, it is not desirable to bond the mechanism element 306 to the bonding layer 402, hence a separation distance at region 408 exists between the mechanism element 306 and the bonding layer 402. In other fabrication processes, a suitable layer of separating material located at the region 408 may be used to prevent bonding of the mechanical element 306 to the bonding layer 402.

A region 410 separates the offset mechanism element 302 from the region 406 of the handle layer 204. The separation between the offset mechanism element 302 and the bonding layer 402 defines an offset distance (OD) that the offset mechanism element 302 will be moved when it is positioned adjacent to the region 406 of the bonding layer 402. During this stage of the fabrication process, the flexure 308 is holding the offset mechanism element 302 substantially in its original position, in view that no substantial forces (other than gravity) are being exerted on the offset mechanism element 302.

Figure 5:
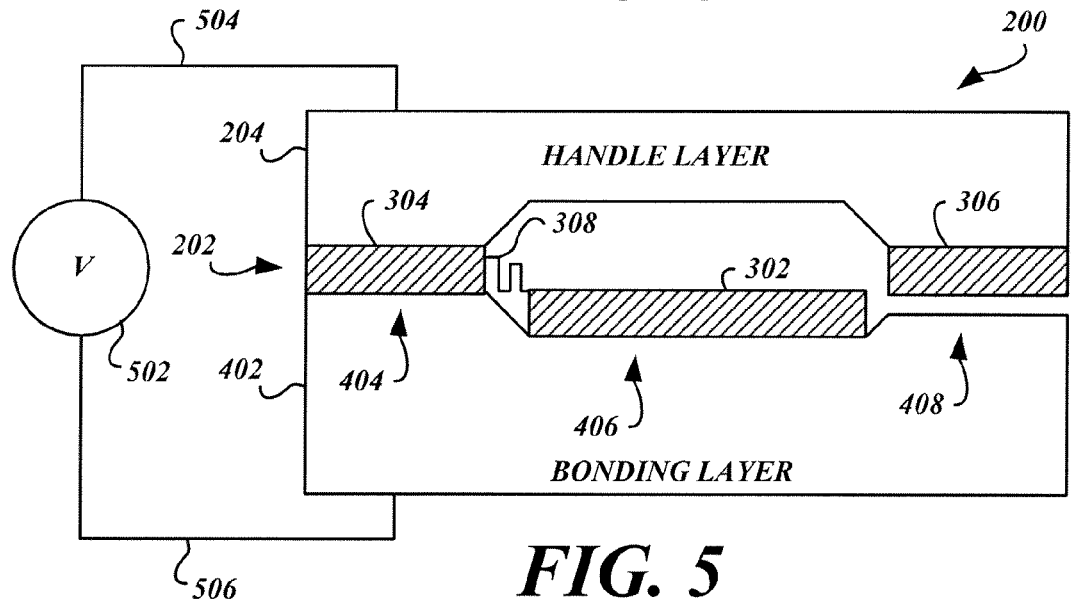
FIG. 5 is a cross section view of the MEMS device during a later stage of its fabrication process wherein the offset mechanism element and mechanism element are bonded to the bonding layer.

FIG. 5 is a cross section view of the MEMS device 200 during a later stage of its fabrication process wherein the offset mechanism element 302 and the mechanism element 304 are to be bonded to the bonding layer 402. In this simplified example of the MEMS device 200, the mechanism element 306 will not become bonded to the bonding layer 402.

When a direct current (DC) voltage, provided by the voltage source 502, is applied across the offset mechanism element 302 and the bonding layer 402, an electrostatic force is generated that attracts the offset mechanism element 302 and the bonding layer 402. That is, the electrostatic force draws the offset mechanism element 302 to the bonding layer 402 at the region 406. The flexible flexure 308 permits movement of the offset mechanism element 302, and also facilitates the formation of an electrostatic charge on the offset mechanism element 302.

In a preferred embodiment, the bonding layer 402 is substantially made of a glass material. As noted above, the electrostatic force between the offset mechanism element 302 and the bonding layer 402 draws the offset mechanism element 302 into its intended offset position at region 406. When the offset mechanism element 302 contacts the bonding layer 402, anodic bonding occurs in a preferred embodiment.

The anodic bonding occurs when the DC voltage, provided by the voltage source 502, is applied across the offset mechanism element 302 and the bonding layer 402. The applied DC voltage also bonds the mechanism element 304 and the bonding layer 402. Heat and/or applied pressure may also facilitate the anodic bonding. The anodic bonding process is well known and is not described in detail herein for brevity.

In some embodiments, the applied voltage that draws the offset mechanism element 302 to the bonding layer 402 is of the same magnitude, or substantially the same magnitude, as the applied bonding voltage that anodically bonds the offset mechanism element 302 and the bonding layer 402. In other embodiments, the voltages may be different.

In this simplified example, a connector 504 electrically couples the handle layer 204 to the voltage source 502. A connector 506 electrically couples the bonding layer 402 to the voltage source 502. When the voltage source 502 is activated, a potential between the offset mechanism element 302 and the bonding layer 402 at region 406 is generated. As noted above, the applied potential anodically bonds the offset mechanism element 302 and the bonding layer 402. Similarly, the applied potential bonds the mechanism element 304 and the bonding layer 402.

Figure 6:
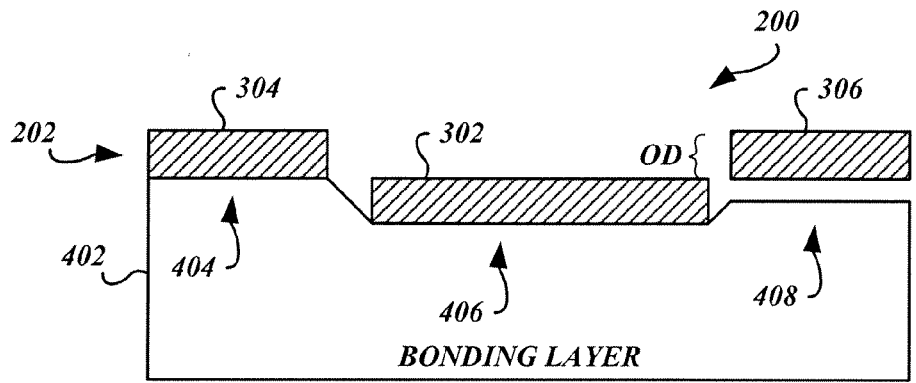
FIG. 6 is a cross section view of the MEMS device during a later stage of its fabrication process wherein the offset mechanism element and the mechanism element have been bonded to the bonding layer, and after the handle layer has been removed.

FIG. 6 is a cross section view of the MEMS device 200 during a later stage of its fabrication process wherein the offset mechanism element 302 and the mechanism element 304 have been bonded to the bonding layer 402, and after the handle layer 204 has been removed. Additionally, the flexure 308 has been removed. The handle layer 204 and/or the flexure 308 may be removed using any suitable process, such as by etching or by another micromachining process. The offset mechanism element 302 has been offset by the offset distance (OD), as measured from the top of the offset mechanism element 302 to the top of the original mechanism layer 202. The amount of offset distance is defined by the structure of the bonding layer 402. The offset distance may be controlled to any desired amount by suitable fabrication of the bonding layer 402 prior to applying the DC potential across the offset mechanism element 302 and the bonding layer 402.

The bonding of the offset mechanism element 302 to the bonding layer 402 at the region 406 secures the offset mechanism element 302 in its offset position. Similarly, the bonding of the mechanism element 304 to the bonding layer 402 secures the mechanism element 304. Since the mechanism element 306 has not been bonded to the bonding layer 402, it may be free to move about in a designed manner.

The bonding of the offset mechanism element 302 and the mechanism element 304 to a silicon bonding layer 402 may be performed using any suitable anodic bonding process. Other suitable bonding processes may be alternatively used. In other embodiments, the bonding layer 402 may be any material of interest, and any suitable bonding process and/or technique may be used to bond the offset mechanism element 302 and/or the mechanism element 304 to the bonding layer 402.

It is appreciated that the above-described fabrication process conceptually describes relevant stages of a fabrication process used to fabricate the exemplary simplified MEMS device 200. That is, the described fabrication of the MEMS device 200 conceptually describes the moving of the offset mechanism element 302 by the electrostatic forces generated between the offset mechanism element 302 and the bonding layer 402. Other stages of an actual fabrication process were not described herein for brevity, but are appreciated by one skilled in the art. Further, some of the conceptual stages described herein may be separated into a plurality of individual stages during the actual fabrication process.

It is further appreciated that the above-described fabrication process, wherein the offset mechanism element 302 is moved to and bonded to the bonding layer 402, describes the fabrication of only a portion of a MEMS device for brevity. Thus, many more mechanical elements of a MEMS device 200 that are not shown or described herein may be concurrently fabricated during the various stages of fabrication. Further, a plurality of offset mechanism elements 320 may be bonded to one or more bonding layers 402. Additionally, the offset distance that a plurality of different offset mechanism elements 302 are offset from the mechanism layer 202 may vary depending upon the structure of the bonding layer 402.

The bonding of the various offset mechanism elements 302 to the bonding layer 402 may occur at different times and/or at different stages of the fabrication process. The connector 504 (FIG. 5) may be directly coupled to a selected offset mechanism element 302 that is to be moved to an offset position. Coupling the connector 504 directly to a selected offset mechanism element 302 would allow controllable anodic bonding.

Additionally, it is appreciated that many hundreds of MEMS devices 200, or even thousands of MEMS devices 200, may be concurrently fabricated on a single die in an integrated fashion during a MEMS fabrication process. The individual MEMS devices 200 may be diced and separated for packaging. Also, it may be desirable to fabricate other types of MEMS devices, and/or other integrated circuit devices, on the same die during the fabrication process.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method that offsets mechanism elements during fabrication of Micro-Electro-Mechanical Systems (MEMS) devices, the method comprising:
   applying a voltage across an offset mechanism element and a bonding layer of a MEMS device to generate an electrostatic charge between the offset mechanism element and the bonding layer, wherein the electrostatic charge draws the offset mechanism element to the bonding layer; and
   bonding the offset mechanism element and the bonding layer.

2. The method of claim 1, wherein applying the voltage comprises:
   applying a direct current (DC) voltage.

3. The method of claim 2, wherein bonding the offset mechanism element and the bonding layer comprises:
   applying the DC voltage while the offset mechanism element is in contact with the bonding layer to anodically bond the offset mechanism element and the bonding layer.

4. The method of claim 1, wherein the applied voltage is a first applied voltage, and wherein bonding the offset mechanism element and the bonding layer comprises:
   applying a second voltage while the offset mechanism element is in contact with the bonding layer to anodically bond the offset mechanism element and the bonding layer.

5. The method of claim 1, further comprising:
   fabricating the offset mechanism element from a portion of a mechanism layer that is bonded to a handle layer;
   etching a portion of the handle layer adjacent to the offset mechanism element to free the offset mechanism element from the handle layer; and
   substantially maintaining a position of the offset mechanism element with respect to the mechanism layer using at least one flexure.

6. The method of claim 5, further comprising:
   fabricating the at least one flexure between the offset mechanism element and the portion of the mechanism layer that is bonded to the handle layer, wherein the at least one flexure flexes to permit the drawing of the offset mechanism element to the bonding layer in response to applying the voltage.

7. The method of claim 6, further comprising:
   removing the flexure in response to completion of the bonding between the offset mechanism element and the bonding layer.

8. The method of claim 1, further comprising:
   applying the voltage to a mechanism element that is in contact with another portion of the bonding layer to anodically bond the mechanism element and the bonding layer.

9. A method that offsets mechanism elements during fabrication of Micro-Electro-Mechanical Systems (MEMS) devices, the method comprising:

generating an electrostatic charge between an offset mechanism element and a bonding layer; and drawing the offset mechanism element to the bonding layer; and anodically bonding the offset mechanism element and the bonding layer, wherein a voltage that generates the electrostatic charge is different from a bonding voltage that anodically bonds the offset mechanism element and the bonding layer.

10. The method of claim 9, wherein generating the electrostatic charge between the offset mechanism element and the bonding layer comprises:

applying a voltage across the offset mechanism element and the bonding layer.

11. The method of claim 10, wherein the applying the voltage comprises:

applying a direct current (DC) voltage.

12. The method of claim 9, wherein anodically bonding the offset mechanism element and the bonding layer comprises:

applying a bonding voltage while the offset mechanism element is in contact with the bonding layer.

* * * * *